(12) United States Patent
Cho et al.

(10) Patent No.: US 8,408,960 B2
(45) Date of Patent: Apr. 2, 2013

(54) METHOD OF FABRICATING AN ORGANIC LIGHT EMITTING DIODE USING PHASE SEPARATION

(75) Inventors: Doo Hee Cho, Kaejeon (KR); Jeong Ik Lee, Gunpo-si (KR); Jin Wook Shin, Incheon (KR); Jong Hee Lee, Daejeon (KR); Hye Yong Chu, Daejeon (KR); Joo Won Lee, Seoul (KR); Jun Han Han, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 13/405,779

(22) Filed: Feb. 27, 2012

(65) Prior Publication Data

US 2012/0156957 A1 Jun. 21, 2012

Related U.S. Application Data

(62) Division of application No. 12/787,134, filed on May 25, 2010, now abandoned.

(30) Foreign Application Priority Data

Nov. 18, 2009 (KR) ........................ 10-2009-0111625

(51) Int. Cl.
*H01J 9/18* (2006.01)

(52) U.S. Cl. .............. 445/33; 445/24; 445/25; 313/504; 313/507

(58) Field of Classification Search .......... 313/498–512; 445/24–25
See application file for complete search history.

(56) References Cited

U.S. PATENT DOCUMENTS

| 2005/0052130 A1 | 3/2005 | Wei et al. | |
| 2005/0231085 A1 | 10/2005 | Song et al. | |
| 2006/0118802 A1 | 6/2006 | Lee et al. | |
| 2007/0013291 A1 | 1/2007 | Cok et al. | |
| 2007/0241668 A1* | 10/2007 | Ottermann et al. | 313/504 |
| 2008/0272382 A1 | 11/2008 | Kim et al. | |
| 2010/0265580 A1* | 10/2010 | Yun et al. | 359/485 |

FOREIGN PATENT DOCUMENTS

| EP | 1727217 A2 | 11/2006 |
| KR | 2004-0030888 A | 4/2004 |
| KR | 2005-0001364 A | 1/2005 |
| KR | 2005-0121691 A | 12/2005 |
| KR | 2006-0064306 A | 6/2006 |
| KR | 2008-0020509 A | 3/2008 |
| KR | 2008-0050899 A | 6/2008 |

* cited by examiner

*Primary Examiner* — Tracie Y Green
(74) *Attorney, Agent, or Firm* — Rabin & Berdo, P.C.

(57) ABSTRACT

A method of fabricating an organic light emitting diode using phase separation. The method includes preparing a transparent substrate. A first light path control layer is formed on the transparent substrate. The first light path control layer includes a mixture of a first medium and a second medium having a lower refractive index than the first medium using the phase separation. An anode, an organic emission layer, and a cathode are sequentially stacked on the first light path control layer. In this method, an OLED with improved light extraction efficiency can be fabricated using a simple and inexpensive process.

10 Claims, 4 Drawing Sheets

METHOD OF FABRICATING AN ORGANIC LIGHT EMITTING DIODE USING PHASE SEPARATION

CROSS-REFERENCE TO RELATED APPLICATION

This application is a divisional of co-pending application Ser. No. 12/787,134 filed on May 25, 2010, and claims priority to and the benefit of Korean Patent Application No. 10-2009-0111625, filed Nov. 18, 2009, the disclosure of which is incorporated herein by reference in its entirety.

BACKGROUND

1. Field of the Invention

The present invention relates to an organic light emitting diode (OLED), and more specifically, to an OLED structured to increase light extraction efficiency.

2. Discussion of Related Art

In a typical organic light emitting diode (OLED), holes emitted from an anode combine with electrons emitted from a cathode in an organic emission layer (EML) formed between the anode and the cathode to generate excitons, and the excitons may recombine to emit light.

An OLED, which is an emissive device, has a wide viewing angle, a fast response speed, and high color reproduction characteristics so that the OLED is widely applied to display devices. Also, a vast amount of research is being conducted on light apparatuses to which OLEDs are applied.

An OLED may be configured to emit red (R), green (G), and blue (B) light or white light. In general, a white OLED may be applied to a lighting apparatus. An OLED applied to a lighting apparatus should have a higher luminance than an OLED applied to a typical display device.

In other words, an OLED having high light extraction efficiency is necessarily required to apply the OLED to a lighting apparatus. However, in a conventional OLED, at least 70% of light emitted by an organic EML may not be externally emitted out of the OLED but totally reflected in the OLED device.

The above-described problem of the conventional OLED will now be described with reference to FIG. 1.

FIG. 1 is a cross-sectional view illustrating a problem caused by total reflection of light in a conventional OLED. Although only the problem of a bottom-emitting OLED shown in FIG. 1 will be described for brevity, the description of the problem may be applied likewise to a top-emitting OLED or a double-sided-emitting OLED.

Referring to FIG. 1, a conventional OLED includes a transparent electrode 140a, an organic EML 150, a reflective electrode 140b, and an encapsulation substrate 160 that are sequentially stacked on a transparent substrate 110. For brevity, it is assumed that, as in a conventional OLED, the transparent electrode 140a and the organic EML 150 have the same refractive index, the transparent substrate 110 has a refractive index n1 lower than that of the transparent electrode 140a, a bottom surface of the transparent substrate 110 is in contact with the air, and the refractive index n1 of the transparent substrate 110 is higher than a refractive index n2 of the air.

In order to explain the problem of total reflection, FIG. 1 illustrates two light paths 201 and 202 which light emitted from the organic EML 150. Meanwhile, Snell's law that expresses a total reflection critical angle is given by Equation 1.

$$\sin\theta_C = \frac{n_2}{n_1}, \quad (1)$$

where $\theta_c$ denotes the total reflection critical angle at an interface between a first medium with a higher refractive index and a second medium with a lower refractive index when light travels from the first medium to the second medium, $n_1$ denotes the refractive index of the first medium, and $n_2$ denotes the refractive index of the second medium.

According to Equation 1, when an incidence angle is lower than the total reflection critical angle $\theta_c$, light may travel toward the second medium without causing total reflection, while when the incidence angle is higher than the total reflection critical angle $\theta_c$, light may be totally reflected toward the first medium.

Referring to FIG. 1, light emitted along the first light path 201 may be incident at an incident angle $\theta_1$ at an interface between the transparent substrate 110 and the air, while light emitted along the second light path 202 may be incident at an incidence angle $\theta_2$ at an interface between the transparent substrate 110 and the air.

The light emitted along the first light path 201 may not be totally reflected by the transparent substrate 110 but externally emitted because the incidence angle $\theta_1$ is smaller than the total reflection critical angle $\theta_c$. However, the light emitted along the second light path 202 may be totally reflected by the transparent substrate 110 and wave-guided along the transparent substrate 110 because the incidence angle $\theta_2$ is greater than the total reflection critical angle $\theta_c$.

Thus, the light extraction efficiency of a conventional OLED may be degraded due to its total reflection characteristics.

In order to solve the problem, various conventional methods have been attempted. However, the methods may substantially have low light extraction efficiency, involve complicated processes, require high fabrication costs, and shorten the lifetime of an organic EML.

Accordingly, it is necessary to develop a method of fabricating an OLED with improved light extraction efficiency at low cost using a simple process.

SUMMARY OF THE INVENTION

The present invention is directed to a method of fabricating an organic light emitting diode (OLED) which light extraction efficiency is improved at low cost using a simple process.

Also, the present invention is directed to a method of fabricating an OLED having improved light extraction efficiency, which is easily applicable to a large-area device.

Other aspects of the present invention can be understood with reference to the following description and exemplary embodiments of the present invention.

One aspect of the present invention provides an OLED using phase separation. The OLED includes: a transparent substrate; a first light path control layer disposed on the transparent substrate, and including a mixture of a first medium and a second medium having a lower refractive index than the first medium using phase separation; and an anode, an organic emission layer (EML), and a cathode sequentially stacked on the first light path control layer.

The OLED may further include at least one of a first refraction layer interposed between the transparent substrate and the first light path control layer and a second refraction layer interposed between the first light path control layer and the anode.

The OLED may further include a second light path control layer disposed under the transparent substrate. The second light path control layer may include a mixture of a third medium and a fourth medium having a lower refractive index than the third medium using the phase separation. In this case, the OLED may further include a third refraction layer interposed between the transparent substrate and the second light path control layer.

The first medium may have a refractive index of 2.0 or higher and lower than 3.0, and the second medium may have a refractive index of 1.0 or higher and lower than 2.0.

Each of the first and third media may be formed of at least one selected from the group consisting of tin oxide ($SnO_2$), titanium oxide ($TiO_2$), cadmium oxide (CdO), zirconium oxide ($ZrO_2$), tantalum oxide ($Ta_2O_3$), and hafnium oxide ($HfO_2$).

Each of the second and fourth media may be formed of at least one selected from the group consisting of silicon oxide ($SiO_2$), aluminum oxide ($Al_2O_3$), silicate glass, and silicon oxide-titanium oxide ($SiO_2$—$TiO_2$) or a mixture of pores containing air or vacuum and the at least one material.

The first through third refraction layers may be formed of at least one of tin oxide ($SnO_2$), titanium oxide ($TiO_2$), cadmium oxide (CdO), zirconium oxide ($ZrO_2$), tantalum oxide ($Ta_2O_3$), hafnium oxide ($HfO_2$), silicon oxide-titanium oxide ($SiO_2$—$TiO_2$), aluminum oxide-titanium oxide ($Al_2O_3$—$TiO_2$), silicate glass, and a silicon oxide-aluminum oxide ($SiO_2$—$Al_2O_3$) solid solution, The first refraction layer may have a refractive index higher than that of the transparent substrate and lower than that of the first medium, and the second refraction layer may have a refractive index higher than that of the anode and lower than that of the first medium. Also, the third refraction layer may have a refractive index higher than that of the transparent substrate and lower than that of the third medium.

The second medium may have a pillar shape perpendicular to the transparent substrate.

Another aspect of the present invention provides a method of fabricating an OLED using phase separation. The method includes preparing a transparent substrate. A first light path control layer is formed on the transparent substrate. The first light path control layer includes a mixture of a first medium and a second medium having a lower refractive index than the first medium using phase separation. An anode, an organic EML, and a cathode are sequentially stacked on the first light path control layer.

The formation of the first light path control layer may include preparing a mixture solution of a precursor of the first medium and a precursor of the second medium. The mixture solution may be coated on the transparent substrate. The coated mixture solution may be gelled by heating to form a coating layer phase-separated into the first and second media having different refractive indices. The coating layer may be calcined.

Before forming the first light path control layer, the method may further include forming a first refraction layer on the transparent substrate. The first refraction layer may have a refractive index higher than that of the transparent substrate and lower than that of the first medium.

Before stacking the anode, the method may further include forming a second refraction layer on the first light path control layer. The second refraction layer may have a refractive index higher than that of the anode and lower than that of the first medium.

The precursor of the first medium may be one of a titanium-alkoxide-based material and a chloro-titanium-alkoxide-based material. The titanium-alkoxide-based material may be one selected from the group consisting of titanium methoxide, titanium ethoxide, titanium propoxide, and titanium butoxide. The chloro-titanium-alkoxide-based material may be one selected from the group consisting of chloro titanium methoxide, chloro titanium ethoxide, chloro titanium propoxide, and chloro titanium butoxide. Also, the precursor of the second medium may be one selected from the group consisting of a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, and a silsesquioxane-silane-based material.

The formation of the first refraction layer may include coating a solution on the transparent substrate. The solution may be formed of a titanium-alkoxide-based material selected from the group consisting of titanium methoxide, titanium ethoxide, titanium propoxide, and titanium butoxide, a chloro-titanium-alkoxide-based material selected from the group consisting of chloro titanium methoxide, chloro titanium ethoxide, chloro titanium propoxide, chloro titanium butoxide, and chloro titanium triisopropoxide, or a mixture of one selected from the titanium-alkoxide-based material and the chloro-titanium-alkoxide-based material with one selected from the group consisting of a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, and a silsesquioxane-silane-based material. The coated solution may be left at room temperature or heated until the coated solution is gelled to form a coating layer. The coating layer may be calcined.

The method may further include adding distilled water and at least one selected from the group consisting of methanol, ethanol, isopropyl alcohol, and buthanol to the mixture solution in order to control the concentration and gelation rate of the mixture solution.

Also, the method may further include adding at least one selected from the group consisting of hydrochloric acid, acetic acid, nitric acid, sulfuric acid, and oxalic acid to the mixture solution in order to control the gelation rate and phase separation rate of the mixture solution and the shape and size of the second medium.

In addition, the method may further include adding at least one selected from the group consisting of acetyl acetone, ethylene glycol, polyethylene glycol, polyethylene oxide, polyvinyl alcohol, and polyvinyl pyrrolidone to the mixture solution in order to control the viscosity, gelation rate, and phase separation rate of the mixture solution and the shape and size of the second medium.

Meanwhile, the method may further include forming a second light path control layer under the transparent substrate. The second light path control layer may include a mixture of a third medium and a fourth medium having a lower refractive index than the third medium using the phase separation.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1:
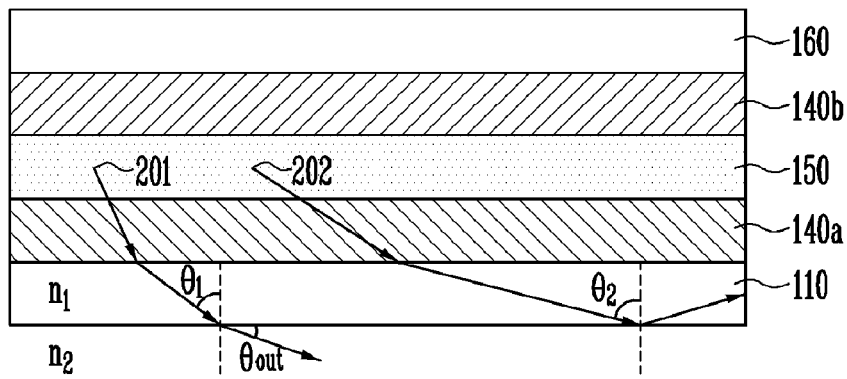
FIG. 1 is a cross-sectional view illustrating a problem caused by total reflection of light in a conventional organic light emitting diode (OLED)

The objects, features, and advantages of the present invention will be apparent from the following detailed description of embodiments of the invention with references to the following drawings. Descriptions of well-known components and processing techniques are omitted so as not to unnecessarily obscure the embodiments of the present invention. The following terms are defined in consideration of functions of the present invention and may be changed according to users or operator's intentions or customs. Thus, the terms shall be defined based on the contents described throughout the specification.

As described in Background, in a conventional OLED, a considerable amount of light emitted by an organic emission layer (EML) may not be emitted out of the OLED but guided in the OLED.

In order to solve these problems, the present invention provides an OLED and a method of fabricating the same, in which a light path control layer capable of refracting and scattering light may be formed using phase separation so that the amount of light guided in a substrate can be reduced to improve light extraction efficiency.

Furthermore, the present invention provides an OLED and a method of fabricating the same, in which an additional refraction layer is formed to improve the adhesion of a light path control layer and facilitate refraction of light so that the amount of light guided in a substrate can be further reduced.

The present invention will be described more fully hereinafter with reference to the accompanying drawings, in which exemplary embodiments of the invention are shown.

For brevity, the present invention will be described with reference to exemplary embodiments applied to a bottom-emitting OLED. However, an OLED using phase separation according to the present invention may be applied to both a top-emitting type and a double-sided-emitting type. Accordingly, the present invention is not limited to the bottom-emitting OLED.

Also, exemplary embodiments of the present invention will now be described under the assumption that a bottom surface of a transparent substrate 110 is in contact with the air as mentioned in Background. In this case, it is assumed that the transparent substrate 110 has a refractive index of n1, the air has a refractive index of n2, and n1>n2. In addition, it is assumed that the transparent substrate 110 has a lower refractive index than an anode 140a, and the anode 140a has the same refractive index as an organic emission layer (EML) 150.

The assumptions are provided to facilitate explanation only and not for purposes of limitation. Even if the assumptions are modified, for example, even if the anode 140a has a different refractive index from the organic EML 150, those modifications may neither affect the technical spirit of the present invention nor preclude attaining the objects of the present invention.

Accordingly, all the following exemplary embodiments will be described with reference to the related drawings based on the above assumptions.

Figure 2A:
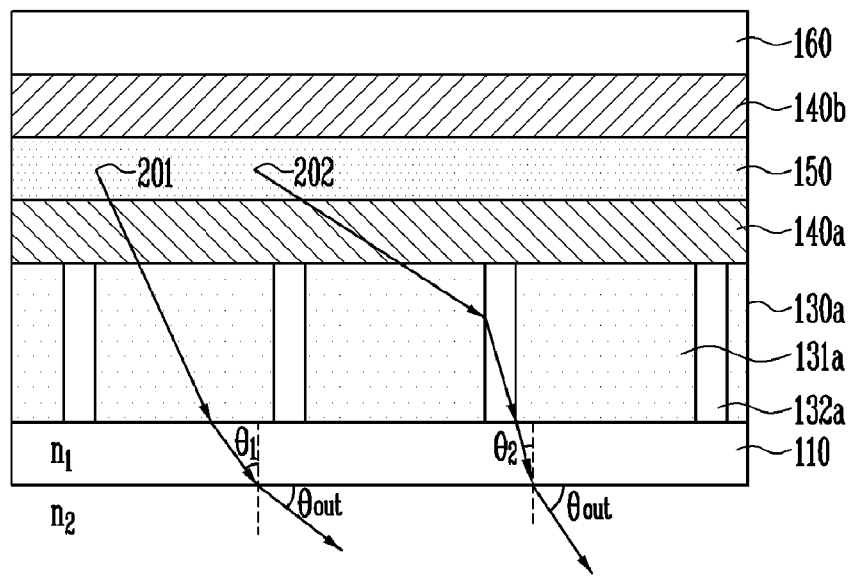
FIGS. 2A and 2B illustrate an OLED using phase separation according to an exemplary embodiment of the present invention.
Figure 2B:
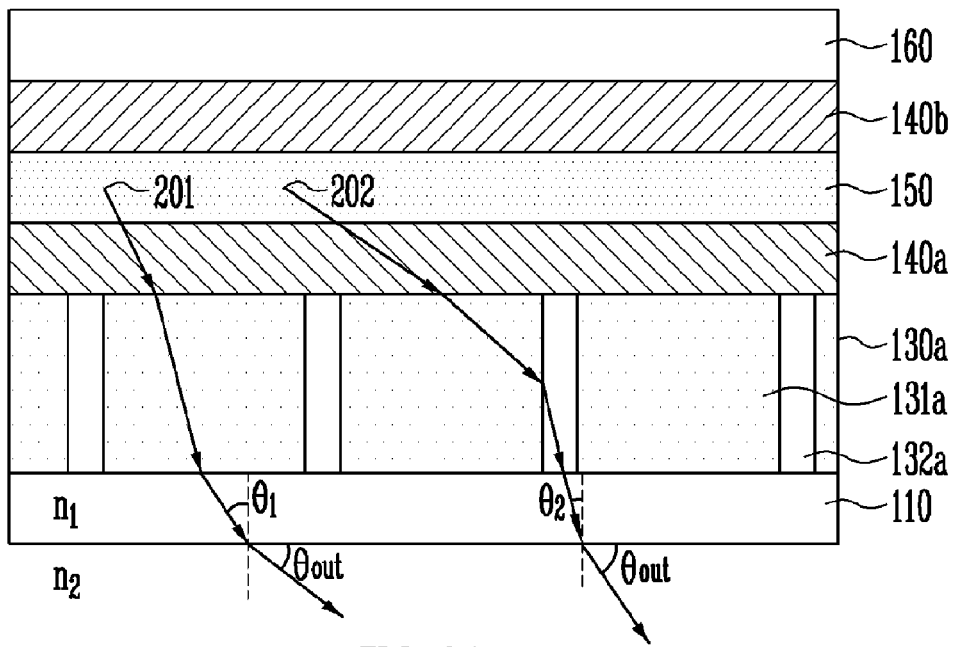

FIGS. 2A and 2B illustrate an OLED using phase separation according to an exemplary embodiment of the present invention.

Referring to FIGS. 2A and 2B, an OLED using phase separation according to an exemplary embodiment of the present invention may include a first light path control layer 130a, an anode 140a, an organic emission layer (EML) 150, and a cathode 140b, which are sequentially stacked on a transparent substrate 110. Meanwhile, an encapsulation layer 160 may be further disposed on the cathode 140b.

The transparent substrate 110, the anode 140a, the organic EML 150, and the cathode 140b may be formed using materials used for a conventional, typical OLED to have thicknesses and shapes corresponding to the conventional, typical OLED. Meanwhile, the anode 140a may be a transparent or semitransparent electrode or an opaque electrode. Also, the cathode 140b may be a transparent or semitransparent electrode or an opaque electrode depending on whether the OLED is a top- or bottom-emitting OLED or a double-sided-emitting OLED.

The first light path control layer 130a according to an exemplary embodiment of the present invention may include a mixture of a first medium 131a and a second medium 132a having different refractive indices.

The first medium 131a may refract light incident from the anode 140a.

The second medium 132a may scatter light due to a difference in refractive index between the first and second media 131a and 132a and may have a lower refractive index than the first medium 131a, preferably, but not necessarily, a lower refractive index than the refractive index of the anode 140a. Also, the second medium 132a may have a pillar shape perpendicular to the transparent substrate 110 in order to improve light extraction efficiency.

The first light path control layer 130a may allow light traveling in a nearly-horizontal direction to the transparent substrate 110 to be scattered at various angles at an interface between the first and second media 131a and 132a. When the light is scattered, the quantity of light incident with the total reflection critical angle $\theta_c$ or more at an interface between the transparent substrate 110 and the air may be reduced, thereby improving light extraction efficiency.

The first medium 131a may be formed of materials having refractive indices of 2.0 or higher and lower than 3.0. Also, the second medium 132a may be formed of materials having refractive indices of 1.0 or higher and lower than 2.0. Particularly, it is desirable that the second medium 132a is formed of materials having refractive index lower than the refractive index of the transparent substrate 110.

The first medium 131a may be formed of at least one selected from the group consisting of tin oxide ($SnO_2$), titanium oxide ($TiO_2$), cadmium oxide (CdO), zirconium oxide ($ZrO_2$), tantalum oxide ($Ta_2O_3$), and hafnium oxide ($HfO_2$), and the second medium 132a may be formed of at least one selected from the group consisting of silicon oxide ($SiO_2$), aluminum oxide ($Al_2O_3$), silicate glass, and silicon oxide-titanium oxide ($SiO_2$—$TiO_2$) or a mixture of pores containing gases, such as air, or vacuum and the at least one material.

The first light path control layer 130a having the above-described composition according to the exemplary embodiment of the present invention may be formed using a phase-separation phenomenon to be described later.

Hereinafter, an improvement in light extraction efficiency of the OLED having the first light path control layer 130a according to an exemplary embodiment of the present invention will be described with reference to FIGS. 2A and 2B.

As described above, the first medium 131a according to an exemplary embodiment of the present invention may have a refractive index ranging from 2.0 to 3.0, and the second medium 132a may have a refractive index which is equal to or higher than 1.0 and lower than the refractive index of the transparent substrate 110. However, the first and second media 131a and 132a may have different refractive indices by various selections of forming materials and process conditions. The transparent substrate 110 and the anode 140a may have various refractive indices by selections of various materials.

Thus, a case i) where the first medium 131a has the same refractive index as the anode 140a and a case ii) where the first medium 131 has a higher refractive index than the anode 140a will now be described with reference to FIGS. 2A and 2B. Meanwhile, the cases i) and ii) will be described under the assumption that the second medium 132a has a lower refractive index than the transparent substrate 110, but the present invention is not limited thereto.

FIG. 2A illustrates a light path in the case i) where the first medium 131a has the same refractive index as the anode 140a.

Referring to FIG. 2A, it can be seen that light emitted along a first light path 201 has the same emission angle $\theta_{out}$, as the conventional OLED described with reference to FIG. 1.

Meanwhile, unlike the conventional OLED described with reference to FIG. 1, light emitted along a second light path 202 may not be totally reflected into the transparent substrate 110 but emitted out of the transparent substrate 110. This is because the light emitted along the second light path 202 may pass through the first light path control layer 130a so that an incidence angle $\theta_2$ of light measured at an interface between the transparent substrate 110 and the air becomes lower than the total reflection critical angle $\theta_c$.

Accordingly, the OLED having the first light path control layer 130a according to the exemplary embodiment of the present invention may have a higher light extraction efficiency than a conventional OLED.

FIG. 2B illustrates a light path in the case ii) where the first medium 131a has a higher refractive index than the anode 140a.

Referring to FIG. 2B, it can be seen that light emitted along the first light path 201 has a same emission angle $\theta_{out}$ to the conventional OLED described with reference to FIG. 1.

Meanwhile, as in FIG. 2A, light emitted along the second light path 202 may not be totally reflected into the transparent substrate 110 but externally emitted. This is because the light emitted along the second light path 202 may pass through the first light path control layer 130a so that an incidence angle $\theta_2$ of light measured at an interface between the transparent substrate 110 and the air becomes lower than the total reflection critical angle $\theta_c$.

On analysis of the exemplary embodiments described above with reference to FIGS. 2A and 2B, it can be seen that when the first medium 131a has a refractive index equal to or higher than that of the anode 140a, light extraction efficiency is improved. Thus, according to the exemplary embodiment of the present invention, the first medium 131a may have a refractive index equal to or higher than that of the anode 140a, preferably.

Hereinafter, a process of forming the first light path control layer 130a using phase separation according to an exemplary embodiment of the present invention will be described in detail.

To begin with, a precursor of a first medium 131a may be mixed with a precursor of a second medium 132a, thereby preparing a mixture solution. The mixture solution may be prepared at a temperature of about 0 to 25° C., and a mixing process may be continued until the mixture solution becomes transparent. A mixture ratio of the precursor of the first medium 131a to the precursor of the second medium 132a may be appropriately determined according to a phase-separated final structure.

The precursor of the first medium 131a may be a titanium-alkoxide-based material or a chloro-titanium-alkoxide-based material. The titanium-alkoxide-based material may be titanium methoxide, titanium ethoxide, titanium propoxide, or titanium butoxide. The chloro-titanium-alkoxide-based material may be chloro titanium methoxide, chloro titanium ethoxide, chloro titanium propoxide, or chloro titanium butoxide.

The precursor of the second medium 132a may be a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, or a silsesquioxane-silane-based material.

Meanwhile, in order to control the concentration and gelation rate of the mixture solution, distilled water and at least one selected from the group consisting of methanol, ethanol, isopropyl alcohol, and buthanol may be added to the mixture solution.

Also, in order to control the gelation rate and phase separation rate of the mixture solution and the shape and size of the second medium 132a, at least one selected from the group consisting of hydrochloric acid, acetic acid, nitric acid, sulfuric acid, and oxalic acid may be added to the mixture solution.

Furthermore, in order to control the viscosity, gelation rate, and phase separation rate of the mixture solution and the shape and size of the second medium 132a, at least one selected from the group consisting of acetyl acetone, ethylene glycol, polyethylene glycol, polyethylene oxide, polyvinyl alcohol, and polyvinyl pyrrolidone may be added to the mixture solution.

After the mixture solution is prepared, the mixture solution may be coated on the transparent substrate 110 using a spin coating process, a dip coating process, or a spray coating process.

Thereafter, the coated mixture solution may be heated, thereby gelling the mixture solution and simultaneously, forming a coating layer phase-separated into the first medium 131a and the second medium 132a having different refractive indices. In this case, the transparent substrate 110 on which the mixture solution is coated may be annealed using a heating oven at a temperature of about 30 to 150□ for 0.5 to 48 hours. The annealing temperature and time may be determined according to a desired final structure.

Thereafter, a coating layer formed by the gelling process may be calcined in order to obtain desired surface state, hardness, and final structure. Phase separation may further occur during the calcination process. In this case, the calcination process needs to be performed at an appropriate temperature for an appropriate time to obtain the desired final structure and prevent occurrence of volatilization during subsequent processes for forming the anode 140a, the organic EML 150, and the cathode 140b.

The calcination process may be performed at a temperature of about 300 to 1500☐ for about 0.5 to 10 hours using an electric furnace. The calcination process may be omitted if required.

When the calcination process is finished, a final structure of the first light path control layer 130a in which the first and second media 131a and 132a having the above-described compositions are repetitively arranged may be obtained. As a result, the first light path control layer 130a may be formed to a thickness of about 100 nm to 10 μm As mentioned above, an OLED according to the present invention may further include a refraction layer capable of changing a light path in order to further improve light extraction efficiency. An OLED including a refraction layer will now be described with reference to FIGS. 3A through 3C.

Figure 3A:
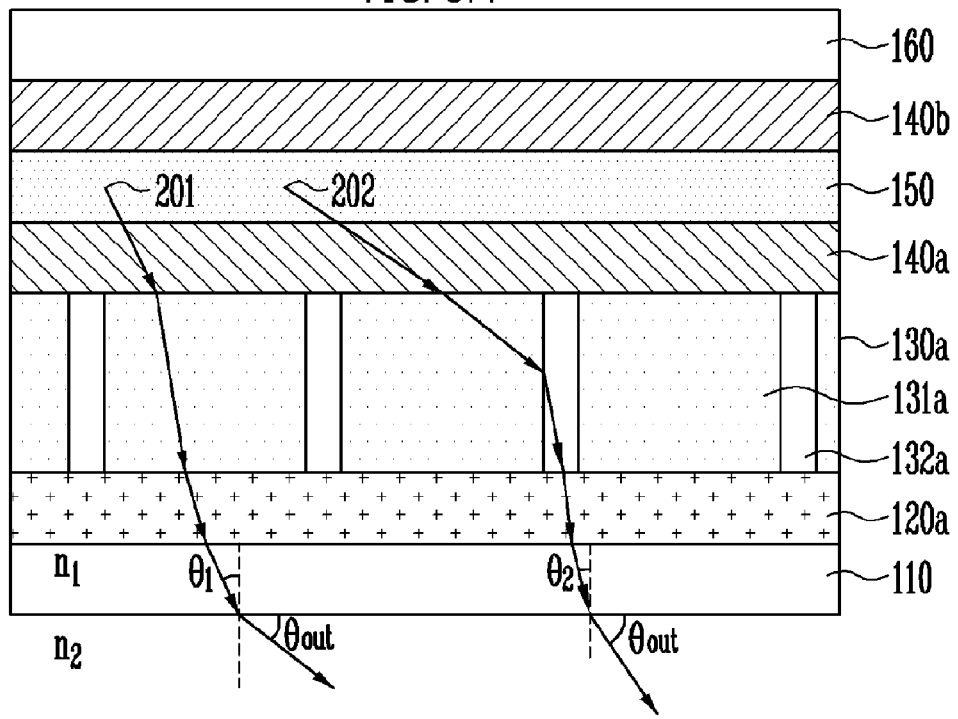
FIGS. 3A through 3C illustrate an OLED using phase separation, which further includes a refraction layer, according to an exemplary embodiment of the present invention.
Figure 3B:
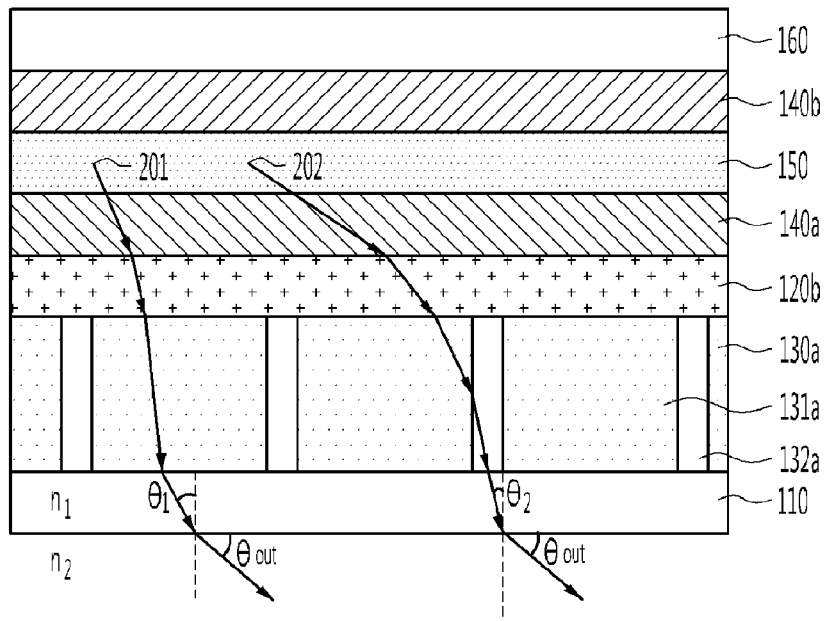
Figure 3C:
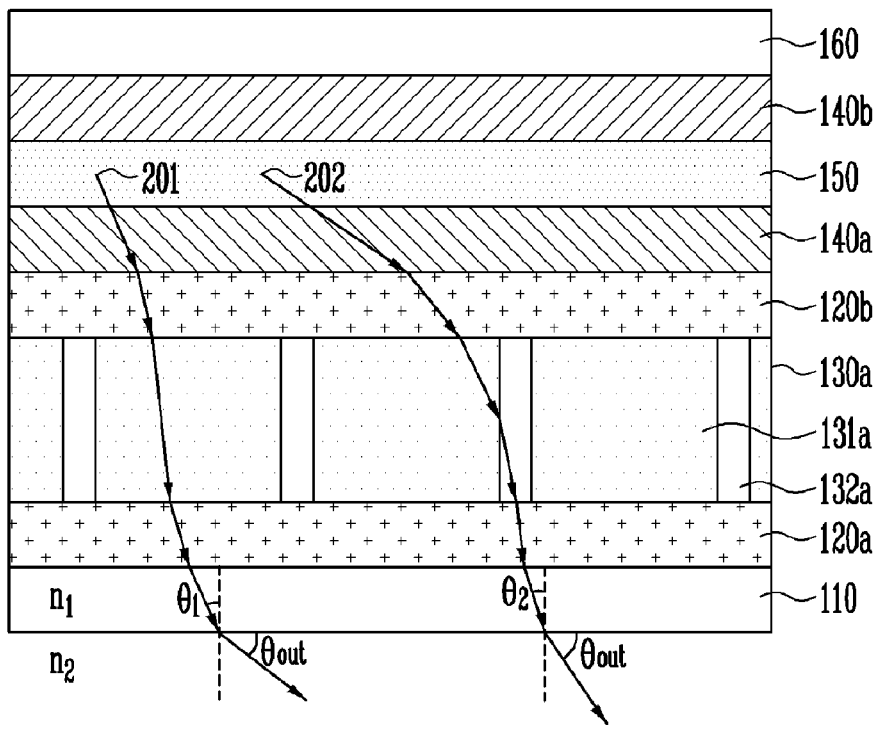

FIGS. 3A to 3C illustrate an OLED using phase separation, which further includes a refraction layer, according to an exemplary embodiment of the present invention.

According to FIGS. 3A to 3C, the OLED according to the exemplary embodiment of the present invention may include at least one of a first refraction layer 120a and a second refraction layer 120b. The first refraction layer 120a may be formed between a transparent substrate 110 and a first light path control layer 130a, while the second refraction layer 120b may be formed between the first light path control layer 130a and an anode 140a.

The refraction layers 120a and 120b may improve the adhesion of the first and second light path control layers 130a and 130b with the transparent substrate 110 or the anode 140a or change a light path in order to allow light to be incident in a direction closer to a perpendicular direction to the transparent substrate 110. Even in the embodiment described with reference to FIG. 2, a light path may cause total reflection at an interface between the transparent substrate 110 and the first light path control layer 130a. Accordingly, the refraction layers 120a and 120b may be formed, thereby reducing the amount of light incident to the interface between the transparent substrate 110 and the first light path control layer 130a with the total reflection critical angle $\theta_c$ or more. As a result, the light extraction efficiency of the OLED may be further improved.

The first refraction layer 120a may have a refractive index lower than that of the first medium 131a and higher than that of the transparent substrate 110.

Meanwhile, the second refraction layer 120b may have a higher refractive index than the anode 140a.

The refraction layers 120a and 120b may be formed of at least one selected from the group consisting of tin oxide ($SnO_2$), titanium oxide ($TiO_2$), cadmium oxide (CdO), zirconium oxide ($ZrO_2$), tantalum oxide ($Ta_2O_3$), hafnium oxide ($HfO_2$), silicon oxide-titanium oxide ($SiO_2$—$TiO_2$), aluminum oxide-titanium oxide ($Al_2O_3$—$TiO_2$), silicate glass, and a silicon oxide-aluminum oxide ($SiO_2$—$Al_2O_3$) solid solution.

A method of forming the refraction layers 120a and 120b having the above-described composition according to an exemplary embodiment of the present invention will be described later.

FIG. 3A is a cross-sectional view of an OLED in which the first refraction layer 120a is formed between the transparent substrate 110 and the first light path control layer 130a. FIG. 3A illustrates an example case where the first medium 131a has a higher refractive index than the anode 140a. For example, the first refraction layer 120a has a refractive index lower than that of the first medium 131a and higher than that of the transparent substrate 110.

Referring to FIG. 3A, light emitted along the first light path 201 may be externally emitted at an interface between the transparent substrate 110 and the air at the same emission angle $\theta_{out}$ as in an OLED without the first refraction layer 120a. Similarly, light emitted along the second light path 202 may be externally emitted at the same emission angle $\theta_{out}$ as in the OLED without the first refraction layer 120a.

Meanwhile, FIG. 3B is a cross-sectional view of an OLED in which the second refraction layer 120b is formed between the anode 140a and the first light path control layer 130a. FIG. 3B illustrates an example case where the first medium 131a has a higher refractive index than the anode 140a.

The second refraction layer 120b may, be formed using the same process as the first refraction layer 120a. For example, the second refraction layer 120b may have a refractive index higher than that of the anode 140a and lower than that of the first medium 131a.

As in FIG. 3A, referring to FIG. 3B, light emitted along the first light path 201 may be externally emitted at the interface between the transparent substrate 110 and the air at the same emission angle $\theta_{out}$ as in an OLED without the second refraction layer 120b. Similarly, light emitted along the second light path 202 may be externally emitted at the same emission angle $\theta_{out}$ as in the OLED without the second refraction layer 120b.

Meanwhile, by forming the first refraction layer 120a, the adhesion of the first light path control layer 130a having a phase separation layer with the transparent substrate 110 may be improved. Since different kinds of materials (i.e., a first medium 131a and a second medium 132a) with different coefficients of thermal expansion and different surface energies are mixed in a phase separation layer corresponding to an interface between the first and second media 131a and 132a, the calcination process may cause roughness to the surface of the phase separation layer and apply complicated stress to the interface, thereby degrading the adhesion of the first light path control layer 130a with the transparent substrate 110. The first refraction layer 120a may have intermediate characteristics between the first and second media 131a and 132a to reduce the stress. Also, since the first refraction layer 120a is not phase-separated, no roughness may be formed on the surface of the first refraction layer 120a so that the first light path control layer 130a can be reliably adhered to the transparent substrate 110. As a result, the adhesion of the first light path control layer 130a with the transparent substrate 110 may be improved.

Meanwhile, FIG. 3C illustrates a case where both the first and second refraction layers 120a and 120b are formed. The second refraction layer 120b may be formed using the same process as the first refraction layer 120a. Preferably, the first refraction layer 120a may have a refractive index lower than that of the first medium 131a and higher than that of the transparent substrate 110. Also, the second refraction layer 120b may have a refractive index higher than that of the anode 140a and lower than that of the first medium 131a.

Referring to FIG. 3C, light emitted along the first light path 201 may be externally emitted at the interface between the transparent substrate 110 and the air at the same emission angle $\theta_{out}$ as in an OLED without the first and second refraction layers 120a and 120b. Similarly, light emitted along the second light path 202 may be externally emitted at the same emission angle $\theta_{out}$ as in the OLED without the first and second refraction layers 120a and 120b.

Although not shown, even in the embodiments described with reference to FIGS. 2A and 2B, a light path may cause total reflection at an interface between the transparent substrate 110 and the first medium 131a. However, when the first refraction layer 120a and/or the second refraction layer 120b are formed as shown in FIGS. 3A through 3C, the amount of light totally reflected by the interface between the transparent substrate 110 and the first light path control layer 130a may be reduced more than when no refraction layer is formed. Accordingly, the first refraction layer 120a and/or the second refraction layer 120b may be formed, thereby improving the light extraction efficiency of the OLED more than when no refraction layer is formed.

Hereinafter, a process of forming the refraction layers 120a, 120b, and 120c having the above-described compositions according to the present invention will be described in detail.

To begin with, a solution for a refraction layer may be prepared. For example, the solution may be prepared at a temperature of about 0 to 25□.

The solution may be one of a titanium-alkoxide-based material and a chloro-titanium-alkoxide-based material. The titanium-alkoxide-based material may be one selected from the group consisting of titanium methoxide, titanium ethoxide, titanium propoxide, and titanium butoxide. The chloro-titanium-alkoxide-based material may be one selected from the group consisting of chloro titanium methoxide, chloro titanium ethoxide, chloro titanium propoxide, chloro titanium butoxide, and chloro titanium triisopropoxide. Alternatively, the solution may be a mixture of one of the titanium-alkoxide-based material and the chloro-titanium-alkoxide-based material with one selected from the group consisting of a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, and a silsesquioxane-silane-based material.

Meanwhile, in order to control the concentration and gelation rate of the mixture solution, distilled water and at least one selected from the group consisting of methanol, ethanol, isopropyl alcohol, and butanol may be added to the mixture solution.

Also, in order to control the gelation rate and phase separation rate of the mixture solution and the shape and size of the second medium 132a, at least one selected from the group consisting of hydrochloric acid, acetic acid, nitric acid, sulfuric acid, and oxalic acid may be added to the mixture solution.

The composition of the mixture solution, and the kinds and amounts of additives may be controlled within such a range as not to cause phase separation to a finally formed layer.

After preparing the mixture solution for the refraction layer, the mixture solution may be coated on the transparent substrate 110 to an appropriate thickness using a spin coating process, a dip coating process, or a spray coating process.

Thereafter, the coated solution may be left to sit at room temperature or heated so that the coated solution can be gelled to form a coating layer. For example, the coated solution may be thermally treated at a temperature of about 30 to 150□ for about 0.5 to 48 hours.

Afterwards, the coating layer formed by the gelation may be calcined. For example, the calcination process may be performed using an electric furnace at a temperature of about 300° C. to 1500° C. for about 0.5 to 12 hours.

When the calcination process is finished, the first refraction layer 120a according to one exemplary embodiment of the present invention may be completed. The calcination process may be omitted if required.

Figure 4A:
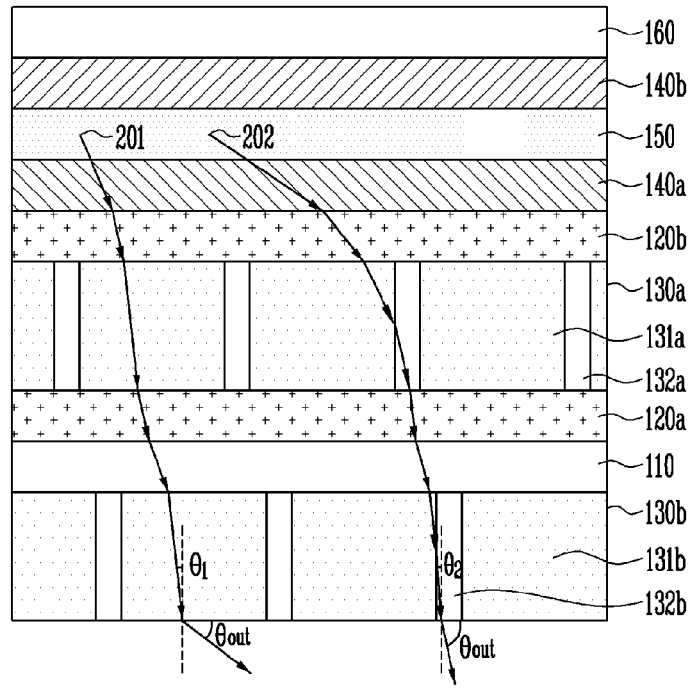
FIG. 4A illustrates an OLED using phase separation, which further includes a second light path control layer, according to an exemplary embodiment of the present invention.

Meanwhile, in order to improve light extraction efficiency, a second light path control layer 130b for changing a light path may be further formed under the transparent substrate 110, as shown in FIG. 4A.

FIG. 4A illustrates an OLED using phase separation, which further includes the second light path control layer 130b formed under the transparent substrate 110.

Referring to FIG. 4A, the second light path control layer 130b may include a third medium 131b and a fourth medium 132b.

The second light path control layer 130b may perform the same function as the first light path control layer 130a and be formed using the same material and process. Thus, the third medium 131b may be formed of the same component as the first medium 131a, while the fourth medium 132b may be formed of the same component as the second medium 132a.

Meanwhile, although each of the second and fourth media 132a and 132b are formed as a pillar type perpendicular to the transparent substrate 110, the present invention is not limited thereto. For example, each of the second and fourth media 132a and 132b may have a circular ball or irregular shape so as to improve light extraction efficiency. Also, though not necessarily, the second and fourth media 132a and 132b may be arranged at optimum, predetermined periods.

Referring to FIG. 4A, it can be seen that an emission angle $\theta_{out}$ of light emitted along the second light path 202 is greater when only a refraction layer is formed as in FIG. 3C. Accordingly, when the second light path control layer 130b is further formed as shown in FIG. 4A, light extraction efficiency may be further improved. In this case, the first and second refraction layers 120a and 120b may not be necessarily formed.

Although not shown, even in the embodiments described with reference to FIG. 3C, a light path may cause total reflection at the transparent substrate 110. However, when the second light path control layer 130b is further formed as shown in FIG. 4A, the amount of light totally reflected by the transparent substrate 110 may be reduced more than in the embodiment described with reference to FIG. 3C. Accordingly, the second light path control layer 130b may be formed, thereby improving the light extraction efficiency of the OLED more than in the embodiment described with reference to FIG. 3C.

Figure 4B:
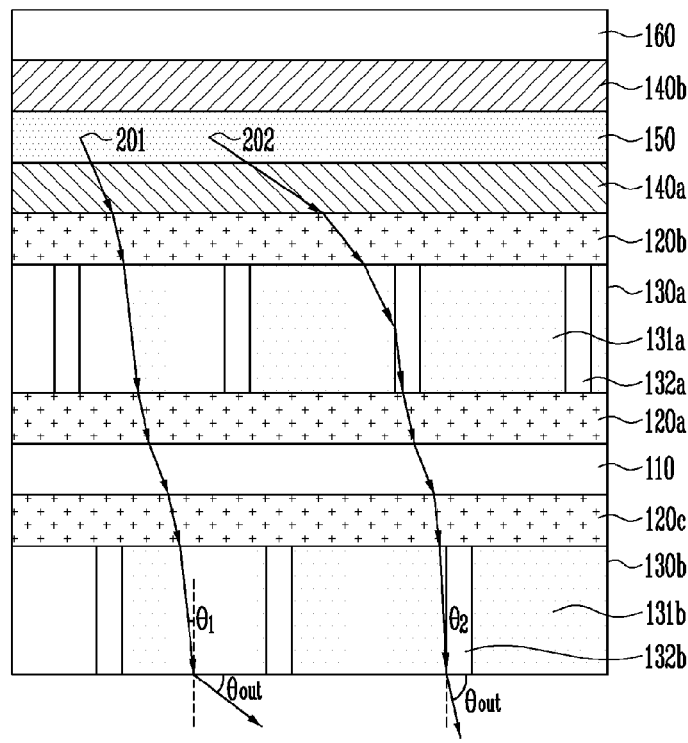
FIG. 4B illustrates an OLED using phase separation, which further includes a third refraction layer, according to an exemplary embodiment of the present invention.

Meanwhile, a third refraction layer 120c may be further formed between the transparent substrate 110 and the second light path control layer 130b as shown in FIG. 4B. Thus, the adhesion of the second light path control layer 130b with the transparent substrate 110 may be enhanced, and a light path may be changed to allow light to be incident in a direction closer to a perpendicular direction to the transparent substrate 110. As a result, the light extraction efficiency of the OLED may be further improved.

FIG. 4B illustrates an OLED using phase separation in which the third refraction layer 120c is further formed between the transparent substrate 110 and the second light path control layer 130b according to an exemplary embodiment of the present invention.

The third refraction layer 120c may perform the same function as the first and second refraction layers 120a and 120b and be formed using the same material and process. The third refraction layer 120c may be formed to have a refractive index higher than that of the transparent substrate 110 and lower than that of the third medium 131b.

Although not shown, even in the embodiment described with reference to FIG. 4A, a light path may cause total reflection at an interface between the transparent substrate 110 and the fourth medium 132b. However, when the third reflection layer 120c is further formed as shown in FIG. 4B, the amount of light totally reflected by the transparent substrate 110 may be reduced more than in the embodiment described with reference to FIG. 4A.

Accordingly, when the third reflection layer 120c is further formed, the light extraction efficiency of the OLED may be further improved than in the embodiment described with reference to FIG. 4A.

Meanwhile, as mentioned above, although only the bottom-emitting OLEDs according to the exemplary embodiments of the present invention are illustrated and described for brevity, the present invention may be applied likewise to top-emitting OLEDs and double-sided-emitting OLEDs. When the present invention is applied to a double-sided-emitting OLED, OLEDs according to exemplary embodiments of the present invention may be symmetrically formed as a mirror type, and a cathode may be formed as a transparent electrode.

According to the present invention as described above, an OLED having light extraction efficiency can be fabricated at low cost using a simple process.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of fabricating an organic light emitting diode (OLED) using phase separation, comprising:
    preparing a transparent substrate;
    forming a first light path control layer on the transparent substrate, the first light path control layer including a mixture of a first medium and a second medium having a lower refractive index than the first medium using phase separation; and
    sequentially stacking an anode, an organic EML, and a cathode on the first light path control layer.

2. The method of claim 1, wherein forming the first light path control layer comprises:
    preparing a mixture solution of a precursor of the first medium and a precursor of the second medium;
    coating the mixture solution on the transparent substrate;
    gelling the coated mixture solution by heating to form a coating layer phase-separated into the first and second media having different refractive indices; and
    calcining the coating layer.

3. The method of claim 1, further comprising, before forming the first light path control layer, forming a first refraction layer on the transparent substrate, the first refraction layer having a refractive index higher than that of the transparent substrate and lower than that of the first medium.

4. The method of claim 1, further comprising, before stacking the anode, forming a second refraction layer on the first light path control layer, the second refraction layer having a refractive index higher than that of the anode and lower than that of the first medium.

5. The method of claim 2, wherein the precursor of the first medium is any one of a titanium-alkoxide-based material such as titanium methoxide, titanium ethoxide, titanium propoxide, or titanium butoxide and a chloro-titanium-alkoxide-based material such as chloro titanium methoxide, chloro titanium ethoxide, chloro titanium propoxide, or chloro titanium butoxide; and the precursor of the second medium is one selected from the group consisting of a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, and a silsesquioxane-silane-based material.

6. The method of claim 3, wherein forming the first refraction layer comprises:
    coating, on the transparent substrate, a solution formed of a titanium-alkoxide-based material such as titanium methoxide, titanium ethoxide, titanium propoxide, or titanium butoxide; a solution formed of a chloro-titanium-alkoxide-based material such as chloro titanium methoxide, chloro titanium ethoxide, chloro titanium propoxide, chloro titanium butoxide, or chloro titanium triisopropoxide; or a mixture solution of one selected from the titanium-alkoxide-based material and the chloro-titanium-alkoxide-based material with one selected from the group consisting of a trialkyloxyvinylsilane-based material, a tetraalkyloxysilane-based material, an allyltrialkylsilane-based material, a tetraalkylsilane-based material, a diphenylsilane-based material, a tetraphenylsilane-based material, an aminoalkyloxysilane-based material, a silsesquioxane-based material, a silsesquioxane-siloxane-based material, and a silsesquioxane-silane-based material;
    gelling the coated solution by leaving the coated solution at room temperature or heating the coated solution to form a coating layer; and
    calcining the coating layer.

7. The method of claim 2, further comprising adding distilled water and at least one selected from the group consisting of methanol, ethanol, isopropyl alcohol, and buthanol to the mixture solution in order to control the concentration and gelation rate of the mixture solution.

8. The method of claim 2, further comprising adding at least one selected from the group consisting of hydrochloric acid, acetic acid, nitric acid, sulfuric acid, and oxalic acid to the mixture solution in order to control the gelation rate and phase separation rate of the mixture solution and the shape and size of the second medium.

9. The method of claim 2, further comprising adding at least one selected from the group consisting of acetyl acetone, ethylene glycol, polyethylene glycol, polyethylene oxide, polyvinyl alcohol, and polyvinyl pyrrolidone to the mixture solution in order to control the viscosity, gelation rate, and phase separation rate of the mixture solution and the shape and size of the second medium.

10. The method of claim 1, further comprising forming a second light path control layer under the transparent substrate, the second light path control layer including a mixture of a third medium and a fourth medium having a lower refractive index than the third medium using phase separation.

* * * * *